(12) United States Patent
Yao et al.

(10) Patent No.: US 11,670,645 B2
(45) Date of Patent: Jun. 6, 2023

(54) ARRAY SUBSTRATE AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Zhixiao Yao, Beijing (CN); Wenfeng Ma, Beijing (CN); Haifeng Yu, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 240 days.

(21) Appl. No.: 17/051,200

(22) PCT Filed: Mar. 3, 2020

(86) PCT No.: PCT/CN2020/077572
§ 371 (c)(1),
(2) Date: Oct. 28, 2020

(87) PCT Pub. No.: WO2020/187015
PCT Pub. Date: Sep. 24, 2020

(65) Prior Publication Data
US 2021/0134850 A1 May 6, 2021

(30) Foreign Application Priority Data
Mar. 15, 2019 (CN) .......................... 201910198006.7

(51) Int. Cl.
*H01L 23/62* (2006.01)
*H01L 27/12* (2006.01)
*H01L 27/02* (2006.01)

(52) U.S. Cl.
CPC ...... *H01L 27/1244* (2013.01); *H01L 27/0248* (2013.01)

(58) Field of Classification Search
CPC ............. H01L 27/1244; H01L 27/0248; H01L 27/124; H01L 27/0288; H01L 27/02;
(Continued)

(56) References Cited

U.S. PATENT DOCUMENTS

2007/0030408 A1* 2/2007 Lin ................... G02F 1/136204
349/40

FOREIGN PATENT DOCUMENTS

CN 1988781 A 6/2007
CN 101290408 A 10/2008
(Continued)

OTHER PUBLICATIONS

China Patent Office, First Office Action dated Jul. 28, 2020 regarding CN201910198006.7 and the English translation thereof.

*Primary Examiner* — Samuel Park
(74) *Attorney, Agent, or Firm* — Houtteman Law LLC

(57) ABSTRACT

The present disclosure provides an array substrate and a display device. The array substrate includes a base substrate; a signal transmission line on the base substrate; at least one electrostatic discharging device and an electrostatic discharging signal line coupled to each other and located at a non-display region of the base substrate. The at least one electrostatic discharging device is configured to discharge static electricity generated in the array substrate. The signal transmission line is coupled with the at least one electrostatic discharging device through at least two branch circuits.

14 Claims, 7 Drawing Sheets

(58) Field of Classification Search
CPC . H01L 27/32; H01L 27/0266; H01L 27/0292; H01L 27/0296; H01L 27/1225; H01L 27/1255; H01L 29/78669; H01L 29/7869; H01L 27/1214; H01L 27/3276; H01L 2924/00; H01L 27/0251; H01L 27/0255; H01L 27/1251; G02F 1/136204; G02F 1/134363; G02F 1/136286; G02F 1/1368; G02F 1/134318; G02F 1/134372; H10K 59/00

See application file for complete search history.

(56) References Cited

FOREIGN PATENT DOCUMENTS

| | | | | |
|---|---|---|---|---|
| CN | 105487317 A | 4/2016 | | |
| CN | 108987445 A | 12/2018 | | |
| CN | 109031827 A | 12/2018 | | |
| CN | 109085724 A | 12/2018 | | |
| CN | 208507683 U | 2/2019 | | |
| CN | 109887979 A | 6/2019 | | |
| JP | S6310558 A | * | 1/1988 | ......... H01L 27/0251 |
| JP | H 1195253 A | 4/1999 | | |

* cited by examiner

ARRAY SUBSTRATE AND DISPLAY DEVICE

CROSS REFERENCE TO RELATED APPLICATIONS

This is a National Phase Application filed under 35 U.S.C. 371 as a national stage of PCT/CN2020/077572, filed on Mar. 3, 2020, an application claiming priority of Chinese Patent Application No. 201910198006.7, filed on Mar. 15, 2019, the contents of which are incorporated herein by reference in its entirety.

TECHNICAL FIELD

The present disclosure relates to the technology field of display panel, and in particular to an array substrate and a display device.

BACKGROUND

Compared with Liquid Crystal Displayers (LCD), Organic Light Emitting Displayers (OLEDs), as new panel displayers, have advantages such as thinness, lightness, a wide viewing angle, active luminescence, continuously adjustable color, a low cost, a high response speed, low energy consumption, a low driving voltage, flexible display and the like.

SUMMARY

As an aspect, an array substrate is provided. The array substrate includes a base substrate; a signal transmission line on the base substrate; and at least one electrostatic discharging device and an electrostatic discharging signal line which are coupled to each other and located at a non-display region of the base substrate. The at least one electrostatic discharging device is configured to discharge static electricity generated in the array substrate. The signal transmission line is coupled with the at least one electrostatic discharging device through at least two branch circuits.

In an embodiment, the signal transmission line is coupled to each of the at least one electrostatic discharging devices through two branch circuits, connection terminals at which the two branch circuits are coupled to the electrostatic discharging device are respectively at opposite sides of the electrostatic discharging device. A connecting point at which the two branch circuits are coupled to each other and the electrostatic discharging device are respectively at two ends of a high incidence position of electrostatic breakdown in the branch circuit.

In an embodiment, the array substrate further includes at least one electrostatic discharging unit in the non-display region of the base substrate and in one-to-one correspondence with the at least one electrostatic discharging device. The electrostatic discharging unit includes a first electrode layer, an intermediate layer on a side of the first electrode layer distal to the base substrate, and a second electrode layer on a side of the intermediate layer distal to the base substrate. The electrostatic discharging device includes a gate electrode layer, a gate insulating layer on a side of the gate electrode layer distal to the base substrate, an active layer on a side of the gate insulating layer distal to the base substrate, and a source electrode and a drain electrode respectively coupled to the active layer, with the gate electrode layer, the gate insulating layer, the active layer being sequentially disposed on the base substrate. A first electrode layer of one electrostatic discharging unit is coupled with a source electrode of a corresponding electrostatic discharging device through a first via hole, and the first electrode layer of the electrostatic discharging unit is coupled with a gate electrode layer of the corresponding electrostatic discharging device through a second via hole.

In an embodiment, the at least one electrostatic discharging device includes a first electrostatic discharging device configured to transmit the static electricity on the signal transmission line to the electrostatic discharging signal line for discharging the static electricity. The at least one electrostatic discharging unit includes a first electrostatic discharging unit corresponding to the first electrostatic discharging device. The first electrostatic discharging unit is configured to discharge the static electricity on the signal transmission line through a second electrode layer of the first electrostatic discharging unit.

In an embodiment, a gate electrode layer and a source electrode of the first electrostatic discharging device are coupled with the signal transmission line. A drain electrode of the first electrostatic discharging device is coupled with the electrostatic discharging signal line. A first electrode layer of the first electrostatic discharging unit is coupled with the signal transmission line.

In an embodiment, the at least one electrostatic discharging device further includes a second electrostatic discharging device configured to transmit static electricity on the electrostatic discharging signal line to the signal transmission line for discharging the static electricity. The at least one electrostatic discharging unit further includes a second electrostatic discharging unit corresponding to the second electrostatic discharging device. The second electrostatic discharging unit is configured to discharge the static electricity on the electrostatic discharging signal line through a second electrode layer of the second electrostatic discharging unit.

In an embodiment, a gate electrode layer and a source electrode of the second electrostatic discharging device are coupled with the electrostatic discharging signal line. A drain electrode of the second electrostatic discharging device is coupled with the signal transmission line. A first electrode layer of the second electrostatic discharging unit is coupled with the electrostatic discharge signal line.

In an embodiment, the first electrode layer is an anode layer. The intermediate layer includes at least one of a hole injection layer, a hole transport layer, a light emitting layer, an electron transport layer and an electron injection layer. The second electrode layer is a cathode layer.

In an embodiment, the signal transmission line is a gate line or a data line, and the electrostatic discharging signal line is a short-circuit ring.

As another aspect, a display device including the above array substrate is provided.

BRIEF DESCRIPTION OF THE DRAWINGS

The accompanying drawings, which provide a further understanding of the present disclosure and constitute a part of the specification, are used in conjunction with the embodiments of the present disclosure to explain the solution of the present disclosure, but are not intended to limit the solution of the present disclosure.

DETAILED DESCRIPTION

In order to enable those skilled in the art to better understand the technical solutions of the present disclosure, an array substrate and a display device provided by the present disclosure will be further described in detail below in conjunction with the drawings.

A high probability of static electricity occurs in the display region of the electroluminescent display panel. In the related art, an electro-static discharging (ESD) device connected to a grounded signal line is provided to release/discharge the static electricity generated in the electroluminescent display panel. The electrostatic breakdown tends to occur at a position where branch circuits intersect with each other due to wiring characteristics of the traditional ESD device, thereby forming a status of data communication short-circuit (DCS). When DCS occurs due to the short-circuit status, poor display such as x-dim line (i.e., x-gradient line) can be caused, which greatly affects the yield of products.

Figure 1:
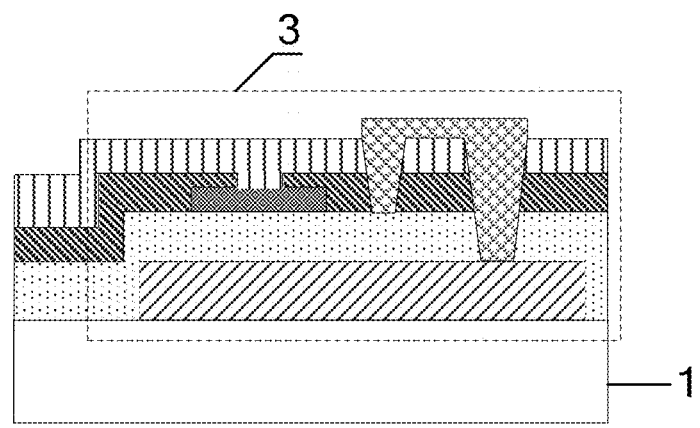
FIG. 1 is a cross-sectional view showing an array substrate according to an embodiment of the present disclosure.
Figure 2:
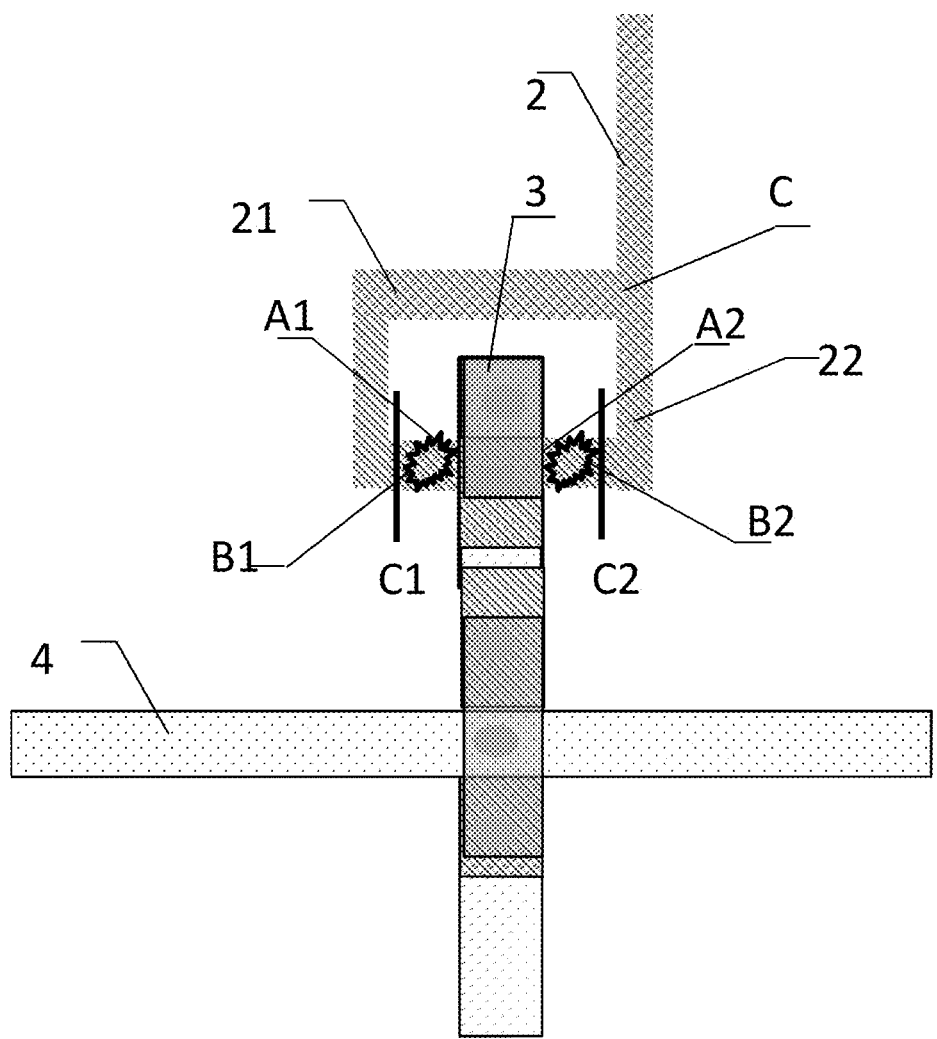
FIG. 2 is a top view showing an array substrate according to an embodiment of the present disclosure.

As shown in FIGS. 1 and 2, an embodiment of the present disclosure provides an array substrate including a base substrate 1, a signal transmission line 2 on the base substrate, a first electrostatic discharging device 3 and an electrostatic discharging signal line 4 which are located in a non-display region of the base substrate. The first electrostatic discharging device 3 is coupled to the electrostatic discharging signal line 4. The first electrostatic discharging device 3 is configured to transmit static electricity from the signal transmission line 2 to the electrostatic discharging signal line 4 for discharging the static electricity. The signal transmission line 2 is coupled with the first electrostatic discharging device 3 through at least two branch circuits (i.e., a branch circuit 21 and a branch circuit 22).

According to the array substrate provided by the embodiment, since the signal transmission line is coupled with the first electrostatic discharging device 3 through the at least two branch circuits, one branch circuit can be cut off when electrostatic breakdown occurs in the branch circuit, and the static electricity generated in the signal transmission line can be continuously transmitted to the electrostatic discharging device 3 through the other branch circuit and can be discharged through the electrostatic discharging signal line 4, thereby continuously realizing the electrostatic protection function, and effectively avoiding the problems such as short circuit and failure of the device due to electrostatic breakdown. The array substrate provided by the embodiment is repairable, and therefore the yield of the product can be improved. In addition, the multiple branch circuits can also play a role in accelerating electrostatic evacuation and more effectively conduct static electricity, thereby achieving the purpose of rapid diffusion of the static electricity.

The signal transmission line 2 may be a data line or a gate line.

As shown in FIG. 2, connection terminals A1 and A2 at which the two branch circuits (i.e., the branch circuit 21 and the branch circuit 22) are coupled to the first electrostatic discharging device 3 are respectively located at opposite sides of the first electrostatic discharging device 3, and the connection point C at which the two branch circuits are coupled to each other and the first electrostatic discharging device 3 are respectively located at two ends of high incidence positions B1 or B2 of electrostatic breakdown on the branch circuit. Specifically, the connection point C and the first electrostatic discharging device 3 are located at two ends of the high incidence position B1 of the electrostatic breakdown. The two ends herein refer to two sides of the position B1 on the branch circuit to which the position B1 belongs, that is, the position B1 is located between the connection point C and the first electrostatic discharging device 3 on the branch circuit (i.e., the branch circuit 21). The connection point C and the first electrostatic discharging device 3 are located at two ends of the high incidence position B2 of the electrostatic breakdown, that is, the position B2 is located between the connection point C and the first electrostatic discharging device 3 on the branch circuit (i.e., the branch circuit 22). When the electrostatic breakdown occurs at the position B1, a laser repair device can perform cut-off operation at the position C1, and the static electricity can still be transmitted to the first electrostatic discharging device 3 through the branch circuit 22, therefore the array substrate can still realize electrostatic protection. When the electrostatic breakdown occurs at the position B2, the cut-off operation can be performed at the position C2, and the static electricity can still be transmitted to the first electrostatic discharging device 3 through the branch circuit 21, therefore the array substrate can still realize electrostatic protection. In the embodiment, a standby branch circuit is designed at a position where static electricity occurs frequently. When the electrostatic breakdown occurs in one branch circuit, the breakdown portion can be cut off by the laser repair device, the standby branch circuit can still keep a connection to the electrostatic discharging device, thereby continuously realizing the electrostatic protection function. The high incidence position of the electrostatic breakdown can be determined through experiments or may be a position where the branch circuits intersect with each other.

Figure 3:
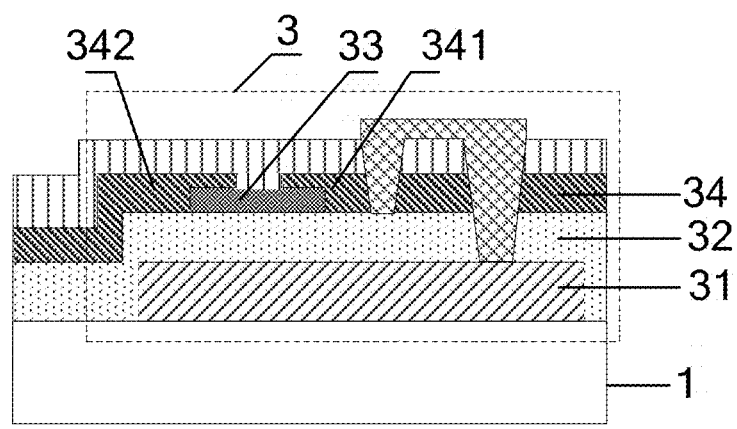
FIG. 3 is a cross-sectional view showing an array substrate according to an embodiment of the present disclosure.

In an embodiment, as shown in FIG. 3, the first electrostatic discharging device 3 includes a gate electrode layer 31, a gate insulating layer 32, an active layer 33, and a source-drain electrode layer 34 sequentially disposed on the base substrate 1. The source-drain electrode layer 34 includes a source electrode 341 and a drain electrode 342 respectively coupled to the active layer 33. The gate electrode layer 31 and the source electrode 341 are coupled to the signal transmission line 2, and the drain electrode 342 is coupled to the electrostatic discharging signal line 4.

Specifically, in the above array substrate provided by the embodiment of the present disclosure, the gate electrode 31 and the source electrode 341 of the first electrostatic discharging device 3 are both coupled to the signal transmission line 2, that is, the gate electrode 31 and the source electrode 341 of the first electrostatic discharging device 3 are coupled together. In this case, the first electrostatic discharging device 3 is equivalent to a diode. When the static electricity on the signal transmission line 2 is accumulated to a certain extent, that is, the static electricity on the signal transmission line 2 is greater than a threshold voltage of the first electrostatic discharging device 3, the first electrostatic discharging device 3 is turned on to supply the static electricity on the signal transmission line 2 to the electrostatic discharging signal line 4 for discharging the static electricity.

Figure 4:
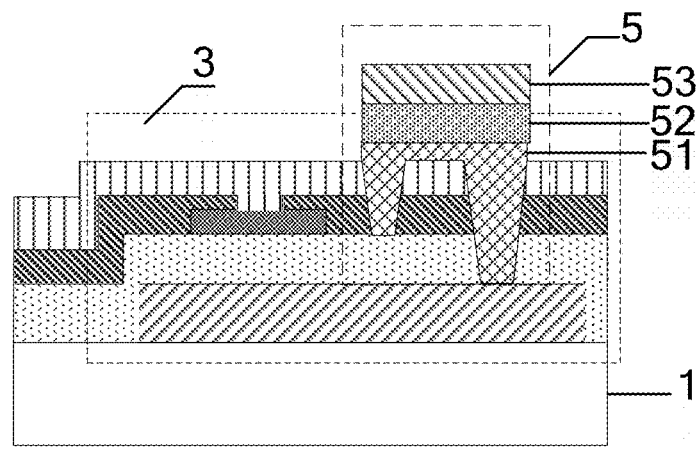
FIG. 4 is a cross-sectional view showing an array substrate according to an embodiment of the present disclosure.

As shown in FIG. 4, an embodiment of the present disclosure provides an array substrate, which further includes, on the basis of the array substrate shown in FIG. 1: the first electrostatic discharging unit 5 in the non-display region of the base substrate. The first electrostatic discharging unit 5 includes a first electrode layer 51, an intermediate layer 52 and a second electrode layer 53. The first electrode layer 51 of the first electrostatic discharging unit 5 is coupled to the signal transmission line 2, and the first electrostatic discharging unit 5 is configured to discharge the static electricity on the signal transmission line 2 through the second electrode layer 53. The first electrode layer 51 is an anode layer, and the second electrode layer 53 is a cathode layer. The cathode layer is multiplexed as a common electrode layer of a counter substrate, and the accumulated static electricity is finally discharged to the outside of the display panel through the common electrode layer.

In the embodiment, the first electrostatic discharging unit 5 is disposed in the non-display region of the array substrate, and the signal transmission line in the display region is coupled to the first electrode layer 51 of the first electrostatic discharging unit 5, so that the static electricity generated in the display region is transmitted to the first electrode layer 51 of the first electrostatic discharging unit 5. The static electricity is transmitted to the second electrode layer 53 of the first electrostatic discharging unit 5 through a structure of the first electrostatic discharging unit 5, and the static electricity is discharged from the second electrode layer 53, thereby alleviating the harm caused by the accumulated static electricity. Specifically, in the above array substrate provided in the embodiment of the present disclosure, the static electricity on the signal transmission line may be evacuated from the first electrode layer 51 to the second electrode layer 53, or the static electricity may be provided to the electrostatic discharging signal line 4 through the first electrostatic discharging device 3 coupled to the signal transmission line, and the static electricity may be discharged outside the display panel through the electrostatic discharging signal line 4. One end of the electrostatic discharging signal line 4 is coupled to the electrostatic discharging device, and the other end of the electrostatic discharging signal line 4 is grounded via another electrostatic discharging device. The electrostatic discharging signal line 4 is for example a short-circuit ring (or shorting ring). Since the other end of the electrostatic discharging signal line 4 is grounded via another electrostatic discharging device, the static electricity from the electrostatic discharging signal line 4 may exist.

It should be noted that when the first electrostatic discharging unit 5 is present, even if the electrostatic breakdown occurs at both of the position B1 and the position B2, a cut-off operation may be performed at the position C1 and the position C2, the electrostatic discharging unit 5 can realize electrostatic protection. Three (3) electrostatic discharging paths including two electrostatic discharging paths formed by two branch circuits 21 and 22 and a third electrostatic discharging path formed by the first electrostatic discharging unit 5 can be realized in the embodiment. When the electrostatic breakdown occurs in one path (or two paths), a laser cutting operation may be carried out while the electrostatic protection function can be still realized.

In an embodiment, the intermediate layers 52 include at least one of a hole injection layer, a hole transport layer, a light emitting layer, an electron transport layer, and an electron injection layer.

Figure 5:
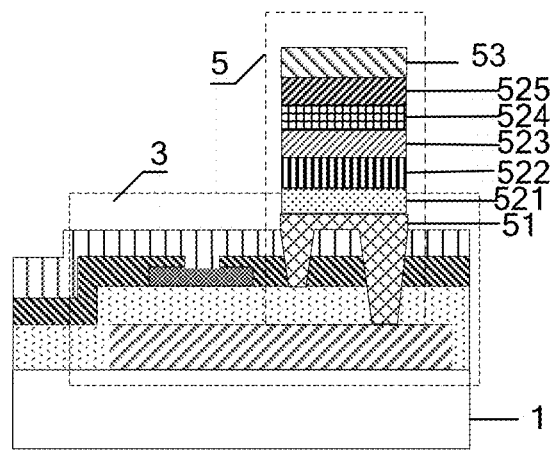
FIG. 5 is a cross-sectional view showing an array substrate according to an embodiment of the present disclosure.

As shown in FIG. 5, the intermediate layer 52 includes a hole injection layer 521, a hole transport layer 522, a light emitting layer 523, an electron transport layer 524, and an electron injection layer 525.

In an embodiment, the connection between the first electrode layer 51 of the first electrostatic discharging unit 5 and the signal transmission line 2 includes: the first electrode layer 51 of the first electrostatic discharging unit 5 is coupled to the source electrode 341 of the first electrostatic discharging device 3 through a first via hole, and the first electrode layer 51 of the first electrostatic discharging unit 5 is coupled to the gate electrode layer 31 of the first electrostatic discharging device 3 through a second via hole. That is, in the embodiment, indium tin oxide (ITO) in a via hole of the first electrostatic discharging device 3 serves as the first electrode layer, and the intermediate layer and the second electrode layer (i.e., the counter substrate) are coated upward from the first electrode layer.

Figure 6:
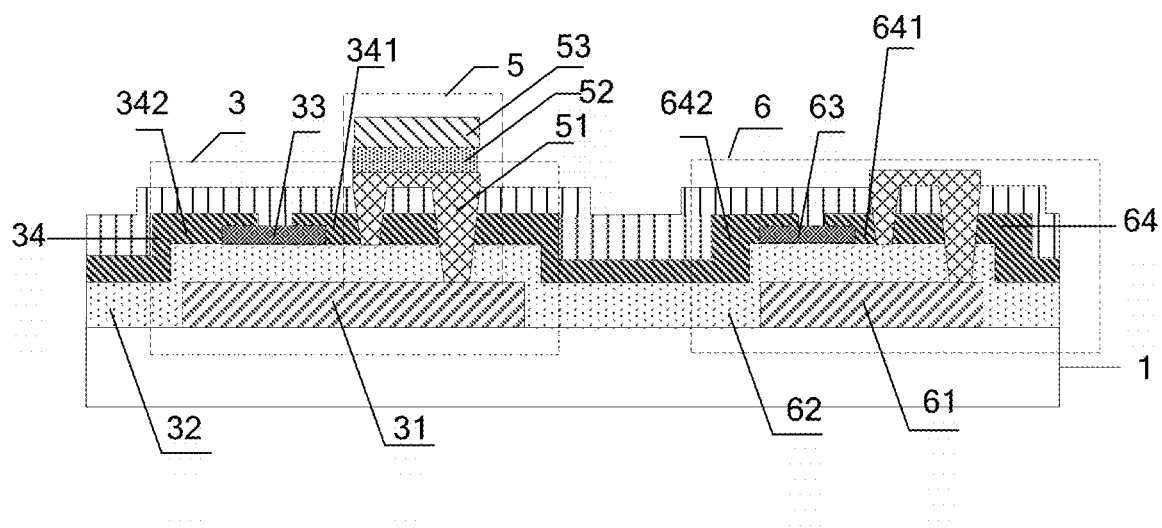
FIG. 6 is a cross-sectional view showing an array substrate according to an embodiment of the present disclosure.

In an embodiment, as shown in FIG. 6, the base substrate further includes a second electrostatic discharging device 6 in the non-display region of the base substrate 1 and the second electrostatic discharging device 6 is coupled to the signal transmission line 2. The signal transmission line 2 is coupled to the second electrostatic discharging device 6 through at least two branch circuits. The second electrostatic discharging device 6 includes a gate electrode layer 61, a gate insulating layer 62, an active layer 63, and a source-drain electrode layer 64 sequentially disposed on the base substrate. The source-drain electrode layer 64 includes a source electrode 641 and a drain electrode 642 respectively coupled to the active layer 63. The drain electrode 642 of the second electrostatic discharging device 6 is coupled to the signal transmission line 2, and the gate electrode layer 61 and the source electrode 641 of the second electrostatic discharging device 6 are coupled to the electrostatic discharging signal line 4.

Specifically, in the above array substrate provided by the embodiment of the present disclosure, the second electrostatic discharging device 6 may transmit the static electricity on the electrostatic discharging signal line 4 to the signal transmission line 2. When the static electricity is accumulated, with the arrangement of the second electrostatic discharging device 6, the static electricity can be transmitted to the signal transmission line 2 through the second electrostatic discharging device 6 for dispersing the static electricity.

The arrangement and connection relationship of the layers of the second electrostatic discharging device 6 are the same as those of the layers of the first electrostatic discharging unit 5 in the above embodiment, and the detailed structure of the second electrostatic discharging device 6 is not described herein again. The gate insulating layer 62 of the first electrostatic discharging unit 5 serves as the gate insulating layer 62 of the second electrostatic discharging device 6. The source electrode 341 of the first electrostatic discharging device 3 serves as the drain electrode 642 of the second electrostatic discharging device 6.

Figure 7:
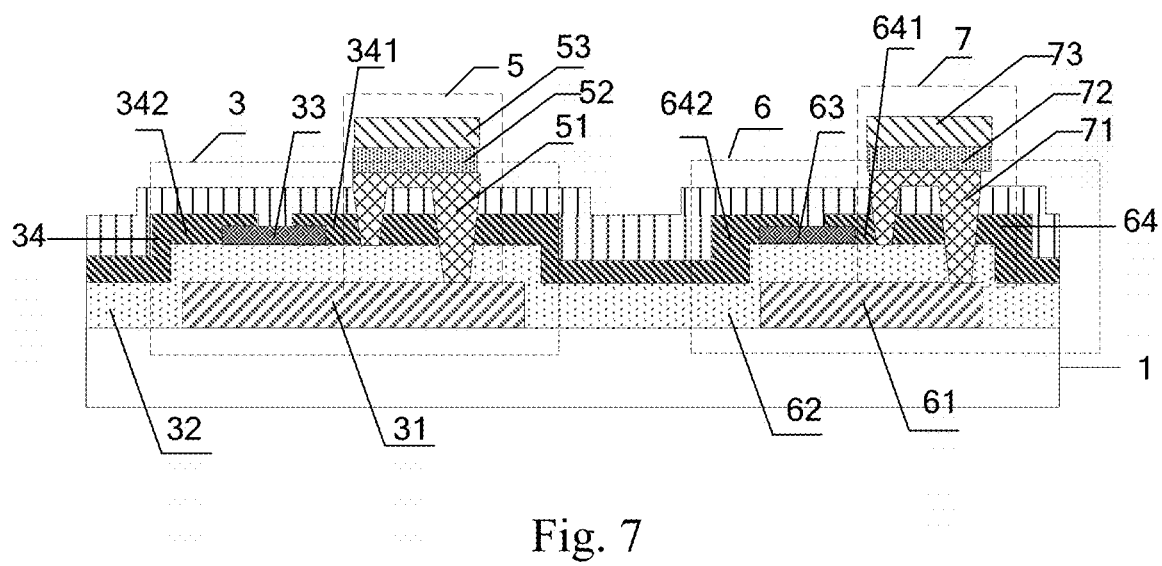
FIG. 7 is a cross-sectional view showing an array substrate according to an embodiment of the present disclosure.

In an embodiment, in the array substrate provided in the embodiment of the present disclosure, the electrostatic discharging signal line 4 is formed in the same layer as the gate electrode layer 31 of the first electrostatic discharging device 3 and the gate electrode layer 61 of the second electrostatic discharging device 6, and the electrostatic discharging signal line 4 is electrically coupled to a first electrode layer 71 of a second electrostatic discharging unit 7 through a via hole. In an embodiment, as shown in FIG. 7, in the array substrate provided in the embodiment of the present disclosure, the array substrate further includes: a second electrostatic discharging unit 7 in the non-display region of the base substrate. The second electrostatic discharging unit 7 includes a first electrode layer 71, an intermediate layer 72, and a second electrode layer 73. The first electrode layer 71 of the second electrostatic discharging unit 7 is coupled to the source electrode 641 of the second electrostatic discharging device 6 through a first via, and the first electrode layer 71 of the second electrostatic discharging unit 7 is coupled to the gate electrode layer 61 of the second electrostatic discharging device 6 through a second via. The second electrostatic discharging unit 7 may discharge the static electricity on the electrostatic discharging signal line 4 through the second electrode layer 73. The first electrode layer 71 is, for example, an anode layer, and the second electrode layer 73 is, for example, a cathode layer.

The second electrode layer 73 of the second electrostatic discharging unit 7 and the second electrode layer 53 of the first electrostatic discharging unit 5 may share a same electrode layer. The static electricity on the signal transmission line 2 is transmitted to the second electrode layer 53 of the first electrostatic discharging unit 5 (i.e. the second electrode layer of the second electrostatic discharging unit 7) through the first electrode layer 51 of the first electrostatic discharging unit 5. The static electricity on the electrostatic discharging signal line 4 is transmitted to the second electrode layer 73 of the second electrostatic discharging unit 7 through the first electrode layer 71 of the second electrostatic discharging unit 7. When a large amount of static electricity is accumulated in the second electrode layer 73, the static electricity is transferred to the first electrode layer 71 of the second electrostatic discharging unit 7, and is transferred to the electrostatic discharging signal line 4 through the first electrode layer 71 of the second electrostatic discharging unit 7 and is discharged out.

In an embodiment, the intermediate layers 72 include at least one of a hole injection layer, a hole transport layer, a light emitting layer, an electron transport layer, an electron injection layer.

The light emitting layer in the non-display region can not only transmit the static electricity, but also can alarm the static electricity. The light emitting layer located in the non-display region emits light, which means that a voltage difference between the anode layer and the cathode layer is present, that is, the static electricity is accumulated in the anode layer or the cathode layer, thereby timely detecting and processing the static electricity, and avoiding the influence of the static accumulation on the performance of the functional layers or device. Since the thicknesses and ion doping concentrations of the above layers in the non-display region are different from those of the layers in the display region due to their different functions, the specific thicknesses and the doping concentrations of the layers may be selected according to applications, which is not limited herein.

Figure 8:
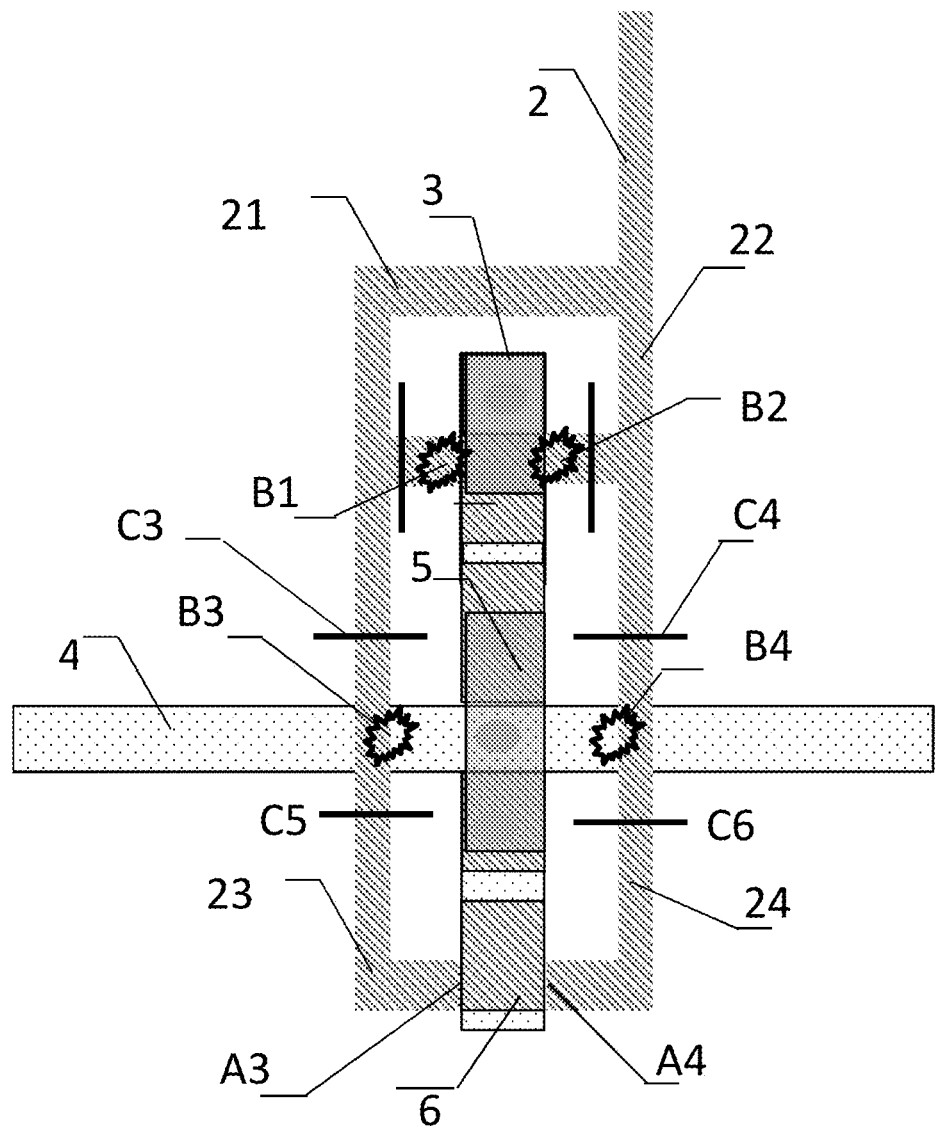
FIG. 8 is a top view showing an array substrate according to an embodiment of the present disclosure.

In an embodiment, as shown in FIG. 8, when the signal transmission line 2 is coupled to the second electrostatic discharging device 6 through two branch circuits (i.e., a branch circuit 23 and a branch circuit 24), connection terminals A3 and A4 at which the two branch circuits are coupled to the second electrostatic discharging device 6 are respectively located at opposite sides of the second electrostatic discharging device 6. A connection point C at which the two branch circuits are coupled to each other and the second electrostatic discharging device 6 are respectively located at two ends of the high incidence positions B3 and B4 of the electrostatic breakdown in the two branch circuits. Specifically, the connection point C and the second electrostatic discharging device 6 are located at two ends of the high incidence position B3 of the electrostatic breakdown, the two ends herein refer to two sides of the position B3 in the branch circuit to which the position B3 belongs, that is, the position B3 is located between the connection point C and the second electrostatic discharging device 6 on the branch circuit to which the position B3 belongs (i.e., the branch circuit 23). The connection point C and the second electrostatic discharging device 6 are located at two ends of the high incidence position B4 of the electrostatic breakdown, that is, the position B4 is located between the connection point C and the second electrostatic discharging device 6 on the branch circuit to which the position B4 belongs (i.e., the branch circuit 24). When the electrostatic breakdown occurs at the position B3, a cut-off operation can be performed at the position C3 or C5, and the static electricity can still be transmitted to the second electrostatic discharging device 6 through the branch circuit 24, therefore the array substrate can still realize electrostatic protection. When the electrostatic breakdown occurs at the position B4, a cut-off operation can be performed at the position C4 or C6, and the static electricity can still be transmitted to the second electrostatic discharging device 6 through the branch circuit 23, therefore the array substrate can still realize electrostatic protection. It should be noted that when the second electrostatic discharging unit 7 is present, even if the electrostatic breakdown occurs at both of the positions B3 and B4, a cut-off operation can be performed at the position C3 or C5, and at the position C4 or C6, and the electrostatic protection can be realized by the second electrostatic discharging unit 7.

Figure 9:
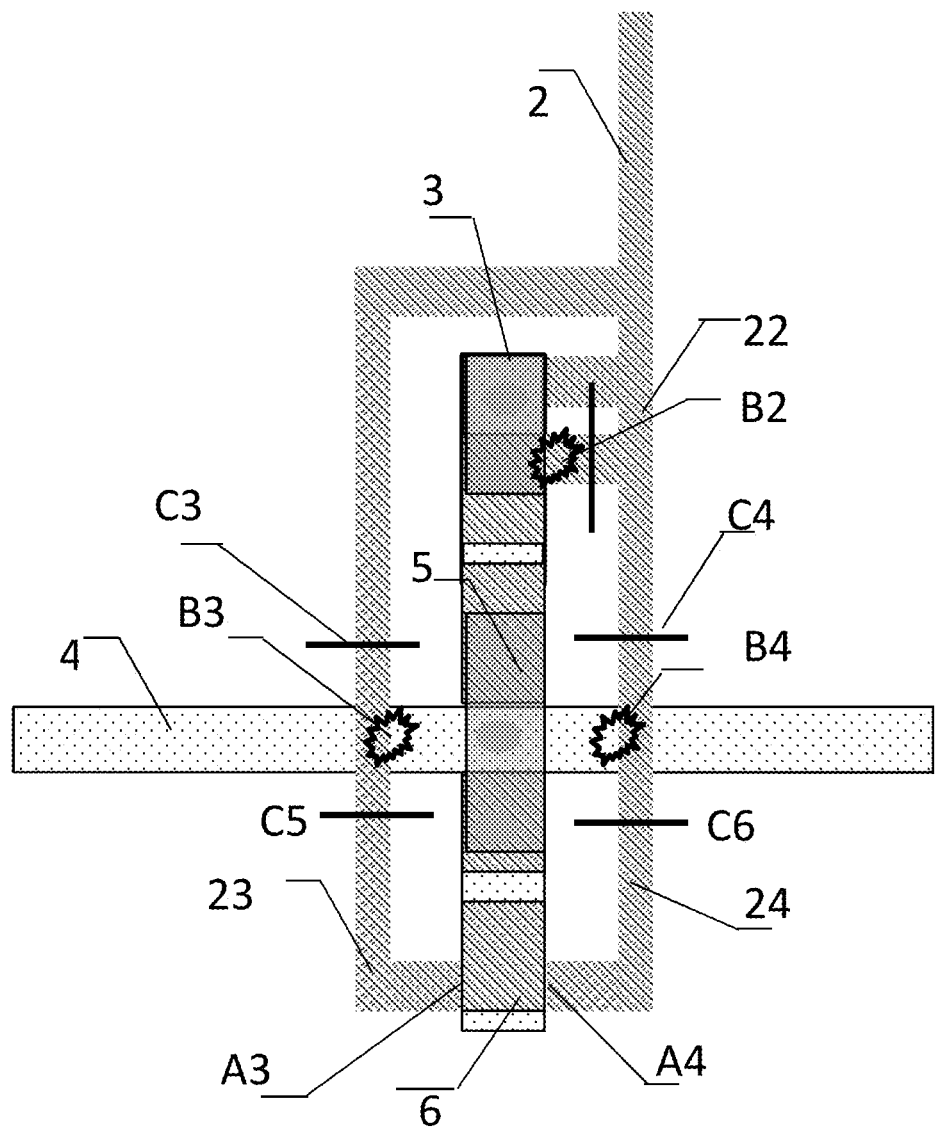
FIG. 9 is a top view showing an array substrate according to an embodiment of the present disclosure.

In an embodiment of the present disclosure, the positions of the branch circuits may be different from the positions as shown in FIG. 8. As shown in FIG. 9, for example, two branch circuits coupled to the first electrostatic discharging device 3 may be on a same side of the first electrostatic discharging device 3.

The array substrate provided by each embodiment has no special requirements on the process steps and the process method, and is naturally formed in the film forming process.

Figure 10:
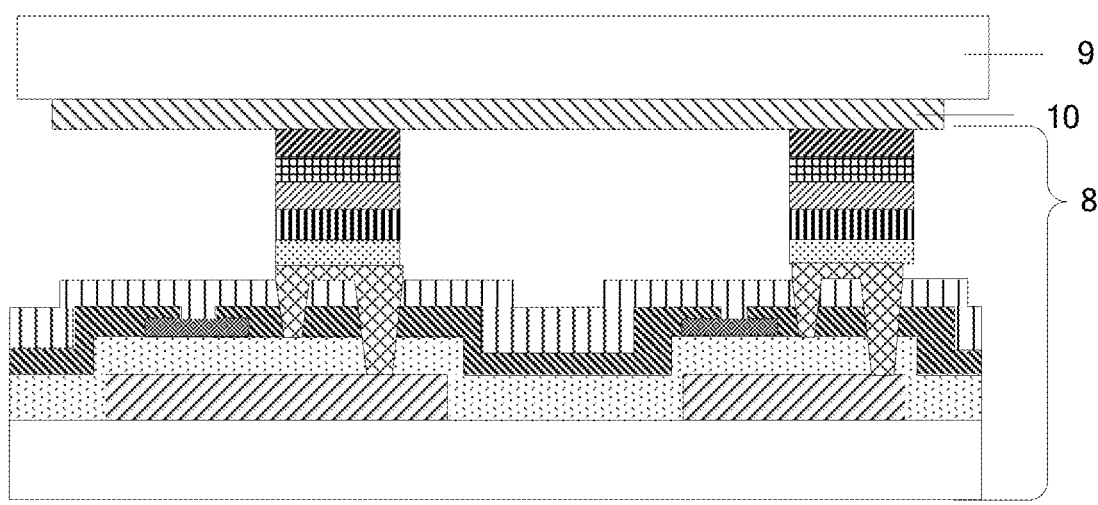
FIG. 10 is a schematic diagram showing a display panel according to an embodiment of the disclosure.

Based on the same disclosure concept, as shown in FIG. 10, an embodiment of the present disclosure further provides a display panel including the array substrates 8 in any one of above embodiments, a counter substrate 9, and a common electrode 10 located on a side of the counter substrate facing the array substrate. The common electrode 10 can be multiplexed as the second electrode layers 53 and 73.

Based on the same disclosure concept, an embodiment of the present disclosure further provides a display device including the array substrate according to any one of above embodiments. The display device is suitable for various displays such as an Organic Electroluminescent Display, an Inorganic Electroluminescent Display, an Active Matrix Organic Light Emitting Diode (AMOLED) and the like. The display device may be any product or component having a display function such as a mobile phone, a tablet computer, a television, a display, a notebook computer, a digital photo frame, a navigator, etc., and is not limited thereto herein.

An embodiment of the present disclosure provides a method for repairing the array substrate according to any one of above embodiments, including: cutting off the branch circuit to which the electrostatic breakdown position belongs when the electrostatic breakdown occurs in the array substrate.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. An array substrate, comprising:
a base substrate;
a signal transmission line on the base substrate; and
at least one electrostatic discharging device and an electrostatic discharging signal line coupled to each other and located at a non-display region of the base substrate, the at least one electrostatic discharging device being configured to discharge static electricity generated in the array substrate, wherein the signal transmission line is coupled with the at least one electrostatic discharging device through at least two branch circuits,
the array substrate further comprises at least one electrostatic discharging unit in the non-display region of the base substrate and in one-to-one correspondence with the at least one electrostatic discharging device, wherein
each of the at least one electrostatic discharging unit comprises a first electrode layer, an intermediate layer on a side of the first electrode layer distal to the base substrate, and a second electrode layer on a side of the intermediate layer distal to the base substrate,
each of the at least one electrostatic discharging device comprises a gate electrode layer, a gate insulating layer on a side of the gate electrode layer distal to the base substrate, an active layer on a side of the gate insulating layer distal to the base substrate, and a source electrode and a drain electrode respectively coupled to the active layer, with the gate electrode layer, the gate insulating layer, the active layer being sequentially disposed on the base substrate,
a first electrode layer of one electrostatic discharging unit is coupled with a source electrode of a corresponding electrostatic discharging device through a first via hole, and
the first electrode layer of the electrostatic discharging unit is coupled with a gate electrode layer of the corresponding electrostatic discharging device through a second via hole.

2. The array substrate according to claim 1, wherein
the at least one electrostatic discharging device comprises a first electrostatic discharging device configured to transmit static electricity on the signal transmission line to the electrostatic discharging signal line for discharging the static electricity,
the at least one electrostatic discharging unit comprises a first electrostatic discharging unit corresponding to the first electrostatic discharging device, the first electrostatic discharging unit being configured to discharge the static electricity on the signal transmission line through a second electrode layer of the first electrostatic discharging unit.

3. The array substrate according to claim 2, wherein
a gate electrode layer and a source electrode of the first electrostatic discharging device are coupled with the signal transmission line,
a drain electrode of the first electrostatic discharging device is coupled with the electrostatic discharging signal line, and
a first electrode layer of the first electrostatic discharging unit is coupled with the signal transmission line.

4. The array substrate according to claim 2, wherein
the at least one electrostatic discharging device further comprises a second electrostatic discharging device configured to transmit the static electricity on the electrostatic discharging signal line to the signal transmission line for discharging the static electricity, and
the at least one electrostatic discharging unit further comprises a second electrostatic discharging unit corresponding to the second electrostatic discharging device, the second electrostatic discharging unit being configured to discharge the static electricity on the electrostatic discharging signal line through a second electrode layer of the second electrostatic discharging unit.

5. The array substrate according to claim 4, wherein
a gate electrode layer and a source electrode of the second electrostatic discharging device are coupled with the electrostatic discharging signal line,
a drain electrode of the second electrostatic discharging device is coupled with the signal transmission line, and
a first electrode layer of the second electrostatic discharging unit is coupled with the electrostatic discharge signal line.

6. The array substrate according to claim 1, wherein
the first electrode layer is an anode layer,
the intermediate layer comprises at least one of a hole injection layer, a hole transport layer, a light emitting layer, an electron transport layer and an electron injection layer, and
the second electrode layer is a cathode layer.

7. The array substrate according to claim 1, wherein
the signal transmission line is a gate line or a data line, and
the electrostatic discharging signal line is a short-circuit ring.

8. A display device comprising the array substrate according to claim 1.

9. A display device comprising the array substrate according to claim 2.

10. A display device comprising the array substrate according to claim 3.

11. A display device comprising the array substrate according to claim 4.

12. A display device comprising the array substrate according to claim 5.

13. An array substrate, comprising:
a base substrate;
a signal transmission line on the base substrate;
a first electrostatic discharging device and an electrostatic discharging signal line coupled to each other and located at a non-display region of the base substrate, the first electrostatic discharging device being configured to discharge static electricity generated in the array substrate; and
a first electrostatic discharging unit in the non-display region of the base substrate and in one-to-one correspondence with the first electrostatic discharging device, wherein
the signal transmission line is coupled to the first electrostatic discharging devices through two branch circuits,
connection terminals at which the two branch circuits are coupled to the electrostatic discharging device are respectively at opposite sides of the electrostatic discharging device, and a connecting point at which the two branch circuits are coupled to each other and the electrostatic discharging device are respectively at two ends of a high incidence position of electrostatic breakdown in the two branch circuits, the first electrostatic discharging unit comprises:

a first electrode layer, an intermediate layer on a side of the first electrode layer distal to the base substrate, and a second electrode layer on a side of the intermediate layer distal to the base substrate, the first electrostatic discharging device comprises:

a gate electrode layer, a gate insulating layer on a side of the gate electrode layer distal to the base substrate, an active layer on a side of the gate insulating layer distal to the base substrate, and a source electrode and a drain electrode respectively coupled to the active layer, with the gate electrode layer, the gate insulating layer, the active layer being sequentially disposed on the base substrate, a first electrode layer of the first electrostatic discharging unit is coupled with a source electrode of the first electrostatic discharging device through a first via hole, and the first electrode layer of the first electrostatic discharging unit is coupled with a gate electrode layer of the first electrostatic discharging device through a second via hole, a gate electrode layer and a source electrode of the first electrostatic discharging device are coupled with the signal transmission line, a drain electrode of the first electrostatic discharging device is coupled with the electrostatic discharging signal line, and a first electrode layer of the first electrostatic discharging unit is coupled with the signal transmission line.

14. The array substrate according to claim 13, further comprising a second electrostatic discharging device and a second electrostatic discharging unit corresponding to the second electrostatic discharging device, the second electrostatic discharging device has the same structure as the first electrostatic discharging device, the second electrostatic discharging unit has the same structure as the first electrostatic discharging unit, a gate electrode layer and a source electrode of the second electrostatic discharging device are coupled with the electrostatic discharging signal line, a drain electrode of the second electrostatic discharging device is coupled with the signal transmission line, and a first electrode layer of the second electrostatic discharging unit is coupled with the electrostatic discharge signal line.

* * * * *